(12) United States Patent
Fatemi et al.

(10) Patent No.: US 7,915,577 B2
(45) Date of Patent: Mar. 29, 2011

(54) SINGLE-SHOT SPATIALLY-RESOLVED IMAGING MAGNETOMETRY USING ULTRACOLD ATOMS

(75) Inventors: Fredrik K. Fatemi, McLean, VA (US); Mark Bashkansky, Alexandria, VA (US); Matthew L. Terraciano, Smithtown, NY (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 225 days.

(21) Appl. No.: 12/434,005

(22) Filed: May 1, 2009

(65) Prior Publication Data

US 2009/0272887 A1 Nov. 5, 2009

Related U.S. Application Data

(60) Provisional application No. 61/071,490, filed on May 1, 2008.

(51) Int. Cl.
*H05H 3/02* (2006.01)
(52) U.S. Cl. .......................... 250/251; 359/326; 600/476
(58) Field of Classification Search .................. 250/251; 359/326; 600/476
See application file for complete search history.

(56) References Cited

U.S. PATENT DOCUMENTS

| | | | | |
|---|---|---|---|---|
| 5,270,853 A * | 12/1993 | Bashkansky et al. | ......... | 359/326 |
| 5,274,232 A * | 12/1993 | Chu et al. | ...................... | 250/251 |
| 5,275,168 A * | 1/1994 | Reintjes et al. | ............... | 600/476 |
| 5,303,710 A * | 4/1994 | Bashkansky et al. | ......... | 600/476 |
| 6,489,609 B1 * | 12/2002 | Baba et al. | ..................... | 250/282 |
| 6,566,651 B2 * | 5/2003 | Baba et al. | ..................... | 250/281 |
| 6,573,491 B1 * | 6/2003 | Marchitto et al. | ............ | 250/251 |
| 6,744,038 B2 * | 6/2004 | Wang et al. | ..................... | 250/251 |
| 6,778,724 B2 * | 8/2004 | Wang et al. | ..................... | 385/16 |
| 6,784,420 B2 * | 8/2004 | Wang et al. | ..................... | 250/251 |
| 6,911,646 B1 * | 6/2005 | Weitekamp | .................... | 250/234 |
| 7,317,184 B2 * | 1/2008 | Kasevich et al. | ............. | 250/251 |
| 7,371,457 B2 * | 5/2008 | Oldenburg et al. | ........... | 428/403 |
| 7,411,187 B2 * | 8/2008 | Monroe et al. | ................ | 250/290 |

(Continued)

OTHER PUBLICATIONS

M. Kasevich, et al., Atomic Velocity Selection Using Stimulated Raman Transitions, Phys. Rev. Lett. 66, 2297 (1991).

(Continued)

*Primary Examiner* — David A Vanore
(74) *Attorney, Agent, or Firm* — Amy Ressing; Joslyn Barritt (57) ABSTRACT

A method and system for remotely imaging a magnetic field within an atom cloud is provided. An atom sample held in a magneto-optical trap is released, and the released atom cloud is illuminated by a Raman beam. Resonant atoms having certain velocities will absorb photon momenta from the Raman beam. The velocities of those resonant atoms will change in response to the absorbed momenta, causing a change in the travel distance of those atoms as compared with non-resonant atoms. The atom cloud is imaged by an imaging device such as a CCD camera and the presence of the resonant atoms is shown in the images as bright lines in the atom cloud. The distance traveled by the resonant atoms and therefore the separation of the lines in the image is a function of the magnetic fields in the atom cloud. The system and method of the present invention can image the magnetic fields within an atom cloud with a high spatial resolution over the entire atom cloud in a single imaging cycle, and analysis of the image provides information regarding the magnetic fields.

20 Claims, 9 Drawing Sheets

U.S. PATENT DOCUMENTS

| | | | | |
|---|---|---|---|---|
| 7,450,618 | B2 * | 11/2008 | Dantus et al. | 372/25 |
| 7,875,958 | B2 * | 1/2011 | Cheng et al. | 257/617 |
| 2006/0249666 | A1 * | 11/2006 | Kasevich et al. | 250/251 |
| 2007/0058686 | A1 * | 3/2007 | Capasso et al. | 372/43.01 |
| 2009/0242743 | A1 * | 10/2009 | Bouyer et al. | 250/251 |
| 2011/0003279 | A1 * | 1/2011 | Patel | 435/5 |

OTHER PUBLICATIONS

V. Boyer, et al., "Deeply subrecoil two dimensional Raman cooling," Phys. Rev. A 70, 043405 (2004).

J. M. McGuirk, "Sensitive absolute gravity gradiometry using atom interferometry," Phys. Rev. A 65, 033608 (2002).

J. Chabé, et al., "Improving Raman velocimetry of laser cooled cesium atoms by spin polarization," Opt. Commun. 274, 254 (2007).

J. Ringot, et al, "Subrecoil Raman spectroscopy of cold cesium atoms," Phys. Rev. A 65, 013403 (2001).

V. Vuletić, et al., "Degenerate Raman Sideband Cooling of Trapped Cesium Atoms at Very High Atomic Densities," Phys. Rev. Lett. 81, 5768 (1998).

T. Isayama, et al., "Observation of Larmor spin precession of laser cooled Rb atoms via paramagnetic Faraday rotation," Phys. Rev. A 59, 4836 (1999).

G. A. Smith, et al, "Faraday spectroscopy in an optical lattice: a continuous probe of atom dynamics," J. Opt. B: Quantum Semiclassical Opt. 5, 323 (2003).

G. Labeyrie, et al., "Large Faraday rotation of resonant light in a cold atomic cloud," Phys. Rev. A 64, 033402 (2001).

M. Terraciano et al., "A single-shot imaging magnetometer using cold atoms," Optics Express, vol. 16, No. 17 pp. 13062-13069 (2008).

M. Terraciano et al., "Magnetically controlled velocity selection in a cold-atom sample using stimulated Raman transitions," Physical Review A 76, 053421 (2007).

M. Terraciano et al., "Velocity-Selective Two-Photon Resonances with Blue and Red Detunings in a Cold Atomic Sample," 2007 Optical Society of America.

\* cited by examiner

SINGLE-SHOT SPATIALLY-RESOLVED IMAGING MAGNETOMETRY USING ULTRACOLD ATOMS

CROSS-REFERENCE

This application claims the benefit of priority based on U.S. Provisional Patent Application No. 61/071,490 filed on May 1, 2008, the entirety of which is hereby incorporated by reference into the present application.

TECHNICAL FIELD

The present invention relates to atomic physics and the measurement of magnetic fields and magnetic field gradients in an atom cloud.

BACKGROUND

In recent years examination and experimentation at the atomic level has increased as part of the quest for knowledge of the basic building blocks of matter.

For example, many experiments have been developed that use stimulated Raman transitions to examine the behavior of an atom sample. Such stimulated Raman transitions use counterpropagating laser beams to stimulate an atom sample and change its energy levels. However, these stimulated Raman transitions that couple atomic ground states with counterpropagating laser beams are resonant only within a narrow velocity band. This phenomenon, known as atomic velocity selection, has proven to be a useful tool for a variety of experiments, including subrecoil Raman cooling, atom interferometry, and atom velocimetry. See U.S. Pat. No. 5,274,232 to Chu et al.; see also M. Kasevich, et al., Atomic Velocity Selection Using Stimulated Raman Transitions," *Phys. Rev. Lett.* 66, 2297 (1991); V. Boyer, et al., "Deeply subrecoil two-dimensional Raman cooling," *Phys. Rev. A* 70, 043405 (2004); J. M. McGuirk, "Sensitive absolute-gravity gradiometry using atom interferometry," *Phys. Rev. A* 65, 033608 (2002); and J. Chabé, et al., "Improving Raman velocimetry of laser-cooled cesium atoms by spin-polarization," *Opt. Commun.* 274, 254 (2007).

Stray magnetic fields can adversely affect this process by shifting the magnetic sublevels, thereby perturbing the participating velocity bands. See M. Kasevich et al., supra, and J. Chabé, et al., supra. See also J. Ringot, et al, "Subrecoil Raman spectroscopy of cold cesium atoms," *Phys. Rev. A* 65, 013403 (2001). Measurement of vector magnetic fields with magnetoresistive probes has been used for active compensation of both dc and ac fields, but needs several sensors placed externally to the vacuum chamber. See J. Ringot, et al., supra.

Elimination of stray fields to submilliGauss levels is particularly important for subrecoil cooling processes. See V. Boyer, et al., supra; V. Vuletić, et al., "Degenerate Raman Sideband Cooling of Trapped Cesium Atoms at Very High Atomic Densities," *Phys. Rev. Lett.* 81, 5768 (1998). Typically, these fields are nulled by Helmholtz coils along each Cartesian direction. Correct compensation currents can roughly be estimated by visual indicators such as atom expansion in an optical molasses, but these cues are strongly dependent on optical alignment. Stray fields can be directly measured using, for example, Faraday spectroscopy, which provides picoTesla sensitivity, but requires additional laser frequencies and time-resolved polarimetry. See T. Isayama, et al., "Observation of Larmor spin precession of laser-cooled Rb atoms via paramagnetic Faraday rotation," *Phys. Rev. A* 59, 4836 (1999); G. A. Smith, et al, "Faraday spectroscopy in an optical lattice: a continuous probe of atom dynamics," *J. Opt. B: Quantum Semiclassical Opt.* 5, 323 (2003); and G. Labeyrie, et al., "Large Faraday rotation of resonant light in a cold atomic cloud," *Phys. Rev. A* 64, 033402 (2001).

These and other experiments and applications that use ultracold atoms thus require a measure of the magnetic field at the atom sample. Because these atom samples are housed in a vacuum chamber at ultrahigh vacuum, i.e., $10^{-9}$ Torr or lower (UHV), optical techniques that interrogate the atom sample with a probe laser beam are required. Mechanical probes cannot access the interior of the chamber without disrupting the integrity of the vacuum.

The optical techniques traditionally used rely on magneto-optic polarization rotation of a probe laser beam. See generally H. J. Metcalf et al., *Laser Cooling and Trapping* (1999). Techniques based on magneto-optic rotation are sensitive but cumbersome to implement. They require multiple laser beams and frequencies, high quality polarization optics, good timing resolution, balanced photodetection, and good optical alignment.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

This invention comprises a system and method for imaging, measuring, and analyzing magnetic fields within an atom cloud with submilliGauss resolution using a sample of cold atoms from a point trap. The system and method of the present invention can image these magnetic fields with a high spatial resolution over the entire atom cloud in a single imaging cycle.

The system includes a vacuum chamber holding an atom sample at ultracold temperatures below about 1 mK. The system also includes three pairs of Helmholtz coils that can be selectively switched on and off to control the magnetic field at the atom sample in the x, y, and z directions. The system further includes one or more lasers serving as a source of two collinear, orthogonally polarized Raman laser beams, and can include a mirror to retroreflect the Raman beam back through the atom sample and a quarter-wave plate to control the polarization of the retroreflected beam. In some embodiments, the system also can include a set of lasers forming a magneto-optical trap (MOT) to confine the atom sample and in some of such embodiments, one or more of the lasers forming the MOT can serve as a source of the Raman beam. Finally, the apparatus includes an imaging system such as a CCD camera that can record the image of the atoms after they have been illuminated by the Raman beam and thus show the magnetic fields.

In the method of the present invention, the effect of velocity-selective two-photon resonances of atoms in a magnetic field is examined to identify and measure the magnitude and profile of the magnetic fields within the atom sample. An atom sample held in the vacuum chamber is released and as it falls is illuminated by two collinear, orthogonally polarized Raman beams traveling in opposite directions. Atoms within a narrow velocity band determined by the magnetic field are resonant with the Raman beams. The resonant atoms absorb two photons and their photon momenta from the Raman beams in a Stimulated Raman Transition (SRT). As a result of its absorbing the photon momenta, the velocity of a resonant atom changes. Because the resonant atoms change their velocity, the number of atoms having their original velocity is reduced and the number of atoms having a new average velocity is increased. The velocity of an atom affects the distance that the atom travels after a given amount of time. The atom cloud is imaged by a CCD camera, and the change in velocity distribution creates a change in the spatial distribution of atoms in the atom cloud which is reflected in distinct features in the image of the atom cloud, with the resonant atoms appearing in the image as parallel or non-parallel (e.g., curved, tilted, or intersecting) lines in the cloud. Because the resonant velocities depend linearly on the magnetic field, information regarding the magnetic field can be obtained by examining the image and measuring the distances traveled by the resonant atoms as reflected in the lines in the image of the atom cloud.

BRIEF DESCRIPTION OF THE DRAWINGS

FIGS. 2A and 2B depict aspects of a distribution of atoms under gravity in a vacuum chamber in the absence and in the presence of a Raman beam in accordance with the present invention. FIG. 2B also shows a sample CCD image taken in a real experiment.

FIGS. 4A and 4B depict CCD images taken in accordance with the present invention showing an atom cloud in a non-uniform magnetic field. FIG. 4B depicts images from a simulation, while FIG. 4A depict images taken in an actual experiment.

DETAILED DESCRIPTION

The invention summarized above can be embodied in various forms. The following description shows, by way of illustration, combinations and configurations in which the aspects can be practiced. It is understood that the described aspects and/or embodiments of the invention are merely examples. It is also understood that one skilled in the art may utilize other aspects and/or embodiments or make structural and functional modifications without departing from the scope of the present disclosure.

For example, although the present invention is described herein in the context of detection of the magnetic field in an atom sample, electric fields may also be measured by the system and method of the present invention because electric fields affect the atom in a similar manner to magnetic fields.

As noted above, the phenomenon of selective atomic velocity resonance in the presence of stimulated Raman transitions has proven to be a useful tool for a variety of experiments, including subrecoil Raman cooling, atom interferometry, and atom velocimetry. The present invention utilizes the sensitivity of velocity selection to magnetic fields to provide a simple non-invasive system and method for imaging magnetic fields with submilliGauss resolution using a sample of cold atoms from a point trap. The technique measures the magnetic field over a region in a single measurement cycle, unlike most techniques which can only measure the field at a single point at a time. The system and method of the present invention can image these magnetic fields with a high spatial resolution over the entire atom cloud in a single measurement cycle. For example, the method of the present invention can achieve spatial resolution well below 1 mm over a region of 1 cm×1 cm in a single shot.

As described in more detail below, the velocity selection behavior of an atom sample can be observed through images of the atom sample under the influence of a Raman beam. In accordance with the present invention, the fluorescence from a ballistically expanding cloud of atoms is imaged onto a CCD camera from a direction orthogonal to the Raman beam axis. At T=Tr (approximately midway through the time needed to fully expand the atom cloud), the atoms are exposed to a pulse from the Raman beam. The momentum of resonant atoms is altered by absorption of two photons, and because the image of the expanded cloud at T=Ti is a record of the average velocity distribution of the atoms, those atoms within the narrow resonant velocity classes add distinct features to the images. In a uniform magnetic field, the resonant planes appear as vertical stripes through the expanded cloud. In a nonuniform magnetic field, the resonant planes can be distorted depending on the gradient, magnitude, and direction of the field. In accordance with the present invention, the characteristics of these distortions provide an intuitive, direct image of the magnetic field within the atom cloud.

Figure 1:
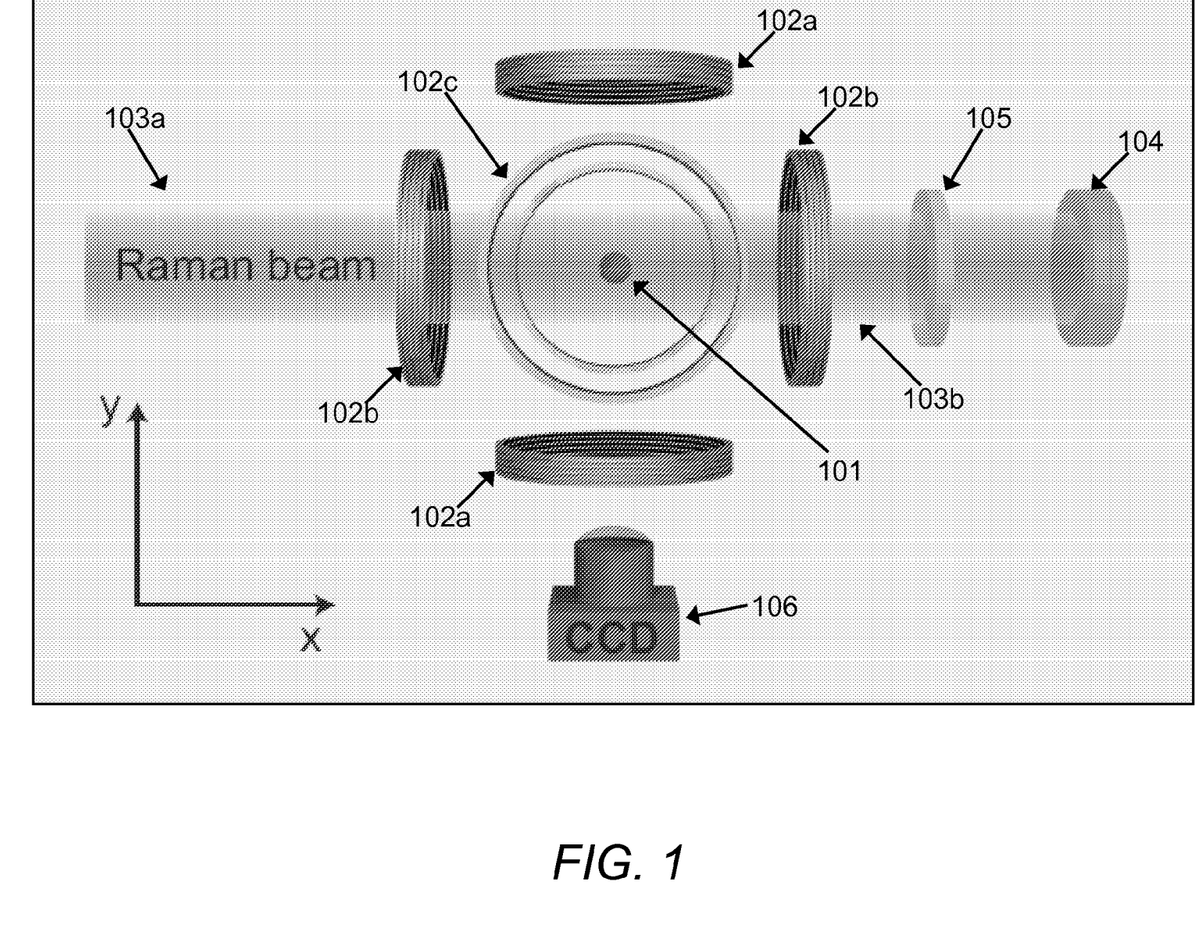
FIG. 1 depicts an exemplary layout of elements in an apparatus for measuring a magnetic field of an atom sample in accordance with the present invention.

FIG. 1 depicts an exemplary embodiment of an apparatus for detecting and measuring the magnetic field of an atom sample in accordance with the present invention. For simplicity, in the description herein, directions discussed with respect to the present invention will be described in terms of their orientation along conventional x, y, and z axes, with the Raman beam being directed along the x-axis and the z axis being aligned with gravity.

An atom sample 101 is held at ultracold temperatures, i.e., at temperatures below about 1 mK in a trap within a vacuum chamber (not shown). The cold atom sample can be obtained by standard techniques relating to the cooling and trapping of atoms, such as those described in H. J. Metcalf et al., supra. In some embodiments, the atom sample can be held in a magneto-optical trap (MOT). An MOT is formed by three pairs of laser beams, the frequencies of which are tuned close to certain atomic energy levels. The photons of these laser beams push the atoms to the center of a vacuum chamber and prevent them from leaving. For atoms with hyperfine structure, two laser frequencies are required to form these traps. One of these, commonly called the "repump" laser, is used to move atoms from the lower hyperfine level to the upper hyperfine level, where the other laser, commonly called the "cooling" laser interacts with them. Because these lasers are stable and have narrow linewidths, and the "repump" laser is far off-resonance when the atoms are in the upper hyperfine level, in some embodiments the "repump" laser can be used as the Raman beam so that an additional laser does not need to be supplied, although in other embodiments a separate laser can be used if desired.

Ideally, the cold atom sample is as small and dense as possible. For example, in an exemplary case, the atom sample in the vacuum chamber has a radius of 0.5 mm, a density of $10^{11}$ atoms/cm$^3$ and a temperature of about 100 μK, though of course, other radii, densities, and temperatures are possible. The vacuum chamber is surrounded by Helmholtz coil pairs 102a, 102b, and 102c oriented in the x and y and z directions, respectively, which can be switched on and off to control a magnetic field within the vacuum chamber. The Helmholtz coils can be used to offset one or more of the ambient magnetic fields so that a zero-magnetic field environment is achieved or to set the magnetic field to a desired strength and orientation. Also, as described below, by varying the current in each of the Helmholtz coils separately, measurements of the orientation of the ambient magnetic fields can be obtained.

The system includes a source (not shown) of Raman beams 103a and 103b, and can include a plane mirror 104, and a quarter-wave plate 105. In the exemplary embodiment depicted in FIG. 1 and described herein, the source of Raman beam 103a/103b comprises a laser which, as noted above can be one of the lasers creating a magneto-optical trap confining the atom sample or can be one or more separate lasers. As described in more detail below, in accordance with the present invention, Raman beam 103a/103b travels along the x-axis and interacts with atom sample 101, and its interaction with the atom sample can be used to measure and analyze a magnetic field within the atom sample. In some embodiments, Raman beam 103a travels in the +x direction along the x-axis and is retroreflected by plane mirror 104 to create a second, collinear Raman beam 103b that propagates in the −x direction and travels back through vacuum chamber 102 and atom sample 101. In such embodiments, quarter-wave plate 105 can be placed between mirror 104 and the vacuum chamber so that the retroreflected Raman beam 103b has a lin ⊥ lin polarization orthogonal to the incident Raman beam 103a. In other embodiments, the Raman beams can comprise a first Raman laser beam 103a traveling in the +x direction and a second, orthogonally polarized Raman laser beam 103b traveling in the −x direction, and in such embodiments mirror 104 and quarter-wave plate 105 will not be present.

The system also includes a photodetector such as CCD camera 106 oriented so that its optical axis is along the y-axis perpendicular to the axis of Raman beam 103a/103b, and can include a computer (not shown) having a memory and software configured to receive and process data of the images taken by CCD camera 106. As described in more detail below, CCD camera 106 can image the atom sample after it has been illuminated by the Raman beam, and in accordance with the present invention, the images taken by CCD camera 106 can be analyzed to provide information regarding the magnetic field of the atom sample.

As shown in the Figures and as described further below, in the method of the present invention, at time $T_0$ the atom sample is released from the trap and begins to fall freely in an atom cloud along the z-axis due to the influence of gravity. Because the atoms are initially confined in a point trap, an image of the atom cloud after expansion is a spatial map of the average velocity distribution, which has been perturbed by the Raman pulse.

Figure 2A:
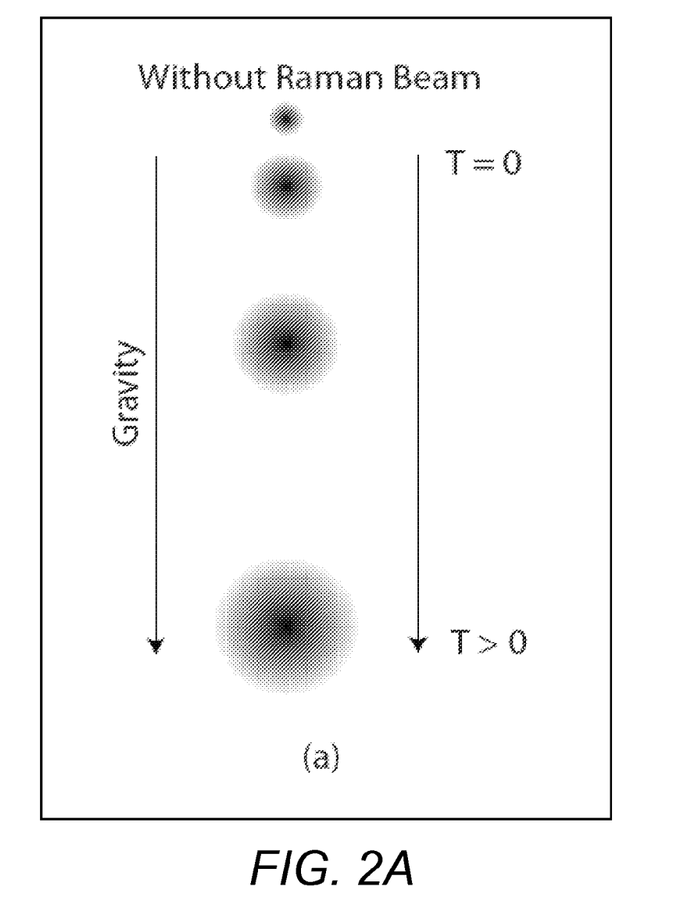
Figure 2B:
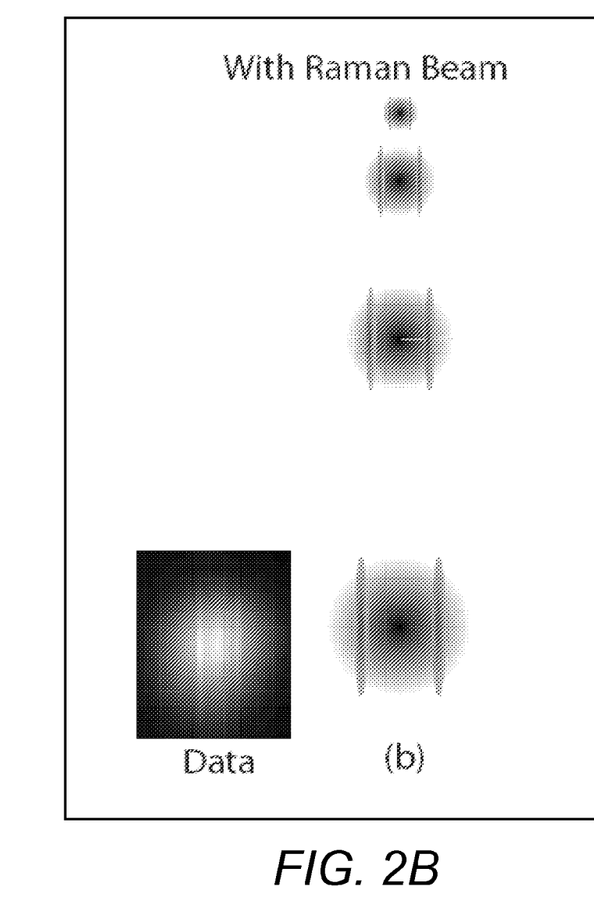

As it falls, the atom cloud can be imaged by an imaging device such as CCD camera 106 shown in FIG. 1, by standard laser induced fluorescence techniques known in the art. At a time Ti, the atoms are imaged by CCD camera 106 and the behavior of the atomic cloud can thus be examined by analyzing the images so taken. FIGS. 2A and 2B present schematic representations of the atom cloud as it falls in accordance with the present invention. As seen in the representations of the atom cloud shown in FIG. 2A, if no Raman beam is present, the atom cloud expands uniformly due to the thermal distribution of velocities of the atoms. If the atom cloud were initially infinitesimally small, then an image of the cloud taken at a later time would be a direct mapping of the velocity distribution onto spatial coordinates, with each point in the image corresponding to a specific average velocity class of atoms.

In accordance with the present invention, Raman beams 103a and 103b, which as described above are a linearly polarized laser beams propagating in the +x and −x directions along a horizontal axis perpendicular to gravity, is pulsed on for a short time T1 centered at time Tr. Raman beams 103a and 103b travel through the vacuum chamber and interacts with atom sample 101. As Raman beams 103a and 103b interact with atom sample 101 during time T1, stimulated Raman transitions occur within atom sample 101. As described in more detail, as the Raman beam is applied, the average velocity distribution of the atom cloud is perturbed, and a change in momentum of certain atoms in the sample occurs due to the interaction of the atom sample with the Raman beam. Only atoms having certain velocities, i.e., that are in resonance with the Raman beam, will exhibit this behavior. These resonant velocities are proportional to the magnetic field in the atom cloud. The atoms having these resonant velocities will absorb two photons and their momenta from the Raman beam, and as a result, the momentum of the resonant atoms will change. In accordance with the present invention, at time Ti>Tr, the atom cloud can be imaged by CCD camera 106, and the effect of the change in momentum of the resonant atoms due to their interaction with the Raman beam can be seen in the resulting image.

An analysis of energy and momentum conservation for the process determines the resonant velocity classes as a function of the magnetic field. An atom initially has a total energy of $E_i = 1/2 p_i^2/2M + m_i g_F \mu_B B$, where $p_i$ is its initial momentum, M is the mass, $m_i$ is the initial magnetic sublevel, $g_F$ is the gyromagnetic ratio, and $\mu_B$ is the Bohr magneton. When the atom absorbs two photons from the Raman beams, two changes occur to the atom. First, the atom's momentum changes by two photon momenta $\hbar k$ so that its final momentum $p_f = p_i \pm 2\hbar k$. Second, the atom's magnetic sublevel changes from its initial sublevel $m_i$ to a new value $m_f$. This change $\Delta m = m_f - m_i$ can take on three possible values, i.e., $\Delta m = 0, \pm 1$. Equating the new energy $E_f = 1/2 p_f^2/2M + m_f g_F \mu_B B$ to the original energy Ei determines the possible values of $p_i$ and $p_f$. We note that oscillations back and forth between $p_f$ and $p_i$ occur during the Raman pulse, so the average momentum can be defined as $p_0 = (p_f + p_i)/2$. The energy equation results in the following expression: $2k \cdot v_0 = \Delta m \omega_L$, where $\omega_L = g_F \mu_B B/\hbar$ is the Larmor precession frequency, and $v_0 = p_0/M$. Thus, the oscillations between $p_0 \pm \hbar k$ lead to an average momentum $p_0$ which is proportional to the magnetic field B. As described in more detail below, this average momentum $p_0$ is reflected in the distribution of atoms as seen in the image, and consequently an examination of the image can yield information regarding the magnetic field.

Thus, as shown in the exemplary representations depicted in FIG. 2B, an image of the atom cloud will no longer be smooth as it is in FIG. 2A, but, as described in more detail below, instead will show a number of vertical stripes extending through the cloud. The separations between these stripes are proportional to the resonant velocity classes; the resonant velocities are proportional to the magnetic field. Thus the separations between these features are a measure of the magnetic field.

Figure 4A:
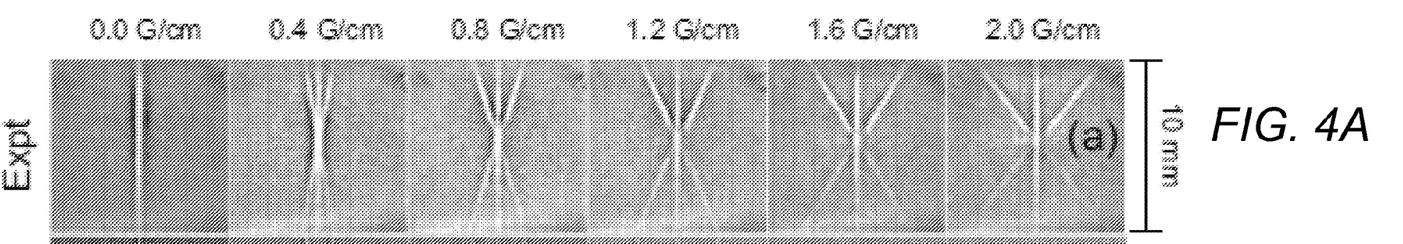
Figure 4B:
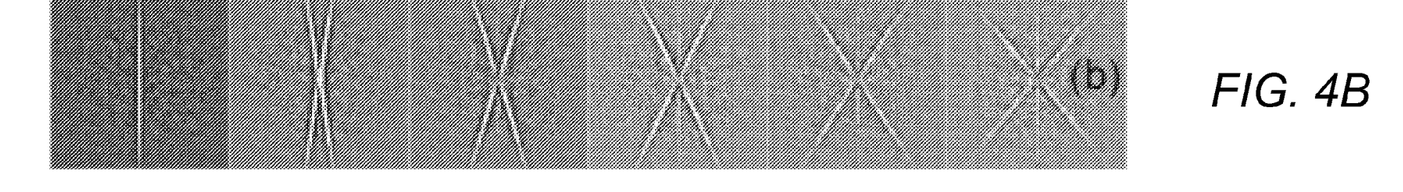

If the magnetic field B in the atom sample is spatially uniform (i.e. B does not depend on position), the change in momentum of the resonant atoms is reflected in two or more parallel vertical stripes appearing in the image of the atom cloud, as shown in FIG. 2, with the separation between the lines being proportional to the magnetic field strength $B=(B_x^2+B_y^2+B_z^2)^{1/2}$. In the CCD image at time Ti, the magnetic-field-dependent features occur at locations $x=\pm\omega_L Ti/2k$, with $\omega_L$, $g_F$, and $\mu_B$ being the Larmor precession frequency, the gyromagnetic ratio, and the Bohr magneton, respectively, as described above. If the magnetic field in the atom sample is not uniform (i.e., is spatially varying), the change in momentum is reflected in the image as two or more non-parallel lines, e.g., curved, tilted, or intersecting lines, appearing in the image, as shown in FIGS. 4A and 4B. The slopes of the lines correspond to a tilt angle θ (as measured from the vertical) reflecting the strength and the distribution of the magnetic field gradient along the x, y, and z directions. More detailed descriptions of the mathematics involved in determining the magnetic field strength can be found in M. Terraciano et al., "A single-shot imaging magnetometer using cold atoms," *Optics Express*, Vol. 16, No. 17 pp. 13062-13069 (2008) and in M. Terraciano et al., "Magnetically controlled velocity selection in a cold-atom sample using stimulated Raman transitions," *Phys. Rev. A* 76, 053421 (2007) which share authors in common with the inventors of the present invention and which are hereby incorporated by reference into the present disclosure in their entirety.

Thus, in accordance with the present invention, analysis of the images taken by CCD camera 106 can provide information regarding the strength and variation of the magnetic field within the atom sample. Although one skilled in the art may be able to make a rough estimate of the magnetic field strength and variation by performing a simple visual inspection of the images, in most cases more precise information regarding the strength and distribution of the magnetic fields is desired. Thus, in some embodiments of the present invention, the analysis of the images can be performed by a computer which can receive data of the images and transform the data of the images and the stripe features into data of the magnetic fields in the atom sample by executing one or more sequences of one or more computer-readable instructions read into memory.

The visibility and other characteristics of the stripes in the images recorded by the CCD camera are dependent on a number of factors. Because the image on the CCD camera is a convolution of the size of the MOT initially holding the atoms with the distribution of their velocities as they fall, the contrast between the atom cloud and the stripes increases for trapped atom samples having smaller physical dimensions. In an exemplary case, the imaging can be performed after the cloud has expanded enough that two velocity classes of the resonant atoms, separated by $\Delta v=2\hbar k/M$, where M=the atom's mass, can be resolved. In such a case, if the initial MOT has a radius R, the imaging can be performed after a time $R/v_{rec}$ from the release of the atoms from the trap, where $v_{rec}=\hbar k/M$, and in this embodiment, the imaging can be performed at time Ti=2Tr. Of course, the atom cloud can be imaged at other times as well, including times less than 2Tr because the effect does not require that the recoil velocities be resolved, only that perturbations to the average velocity distribution can be observed.

In addition, most of the atoms in the atom cloud are not resonant with the Raman beams incident upon them. As described in more detail below, whether an atom is resonant with the Raman beam depends on the atom's velocity with respect to the wavevectors of the photons from the Raman beam. For example, for the x-directed orientation of the Raman beam described herein, it is $v_x$, i.e. the x-component of velocity v, that determines resonance. When the Raman pulse is applied, the momentum of those atoms that are resonant will change such that their average momentum as they fall after being released from the magneto-optical trap is $p_0=Mv_0$ where $v_0$ is the average velocity of the individual resonant atoms in the cloud. As discussed in above, for atoms having with speeds $|v_x|=|v_{0x}|-\hbar k/M$ increase $|v_x|$ by $2\hbar k/M$, while those having speeds $|v_x|=|v_{0x}|+\hbar k/M$ decrease $|v_x|$ by 2 ℏk/M. Thus, in an image of the atom cloud such as an image taken by CCD camera 107, there is an enhancement in the number of atoms that have momenta $p_0$ and a reduction in the number of atoms with momenta $p_0\pm\hbar k$. This process is illustrated in the schematic shown in FIG. 3 and in the images shown in FIG. 6A, as described in more detail below.

Figure 3:
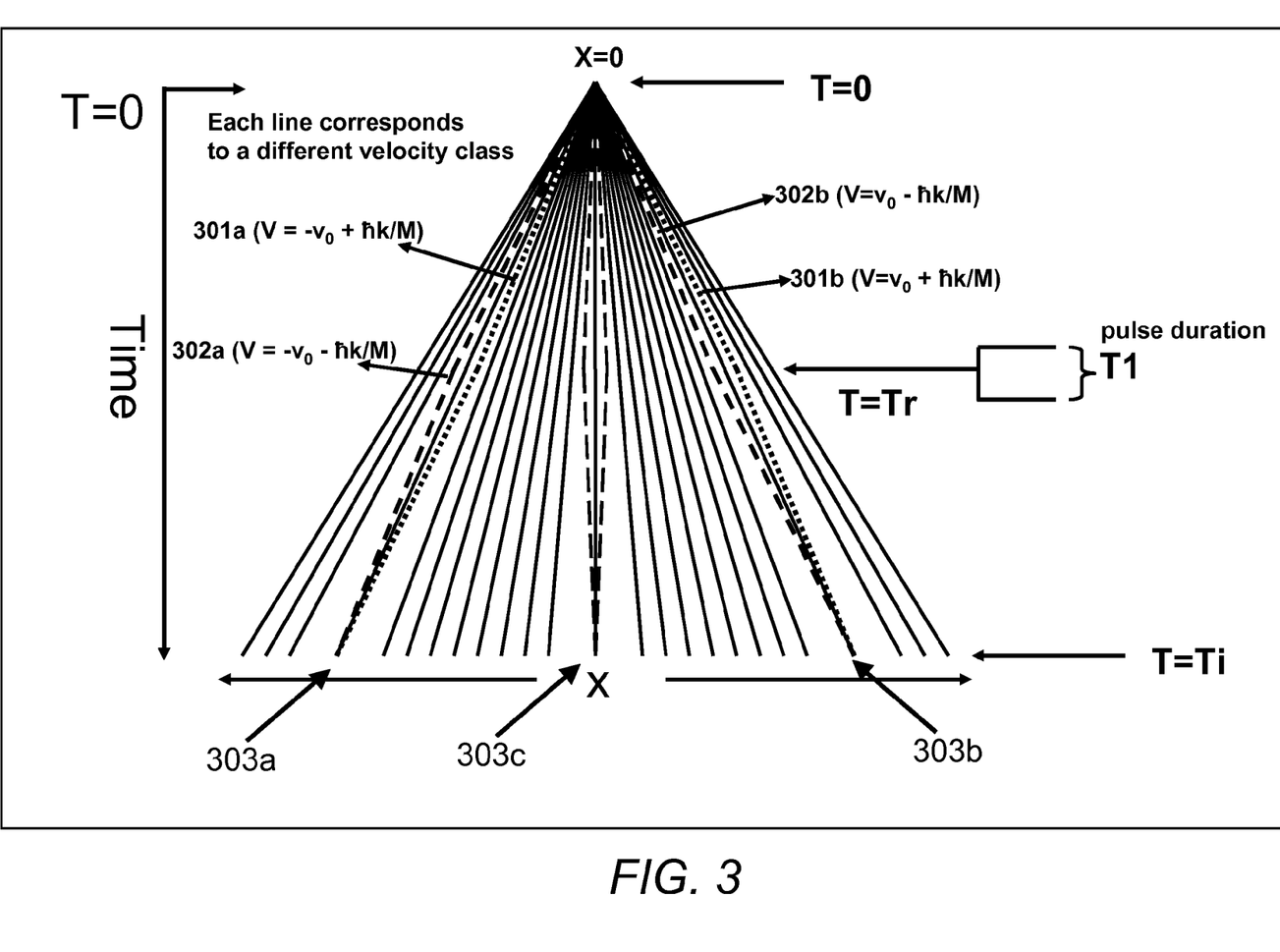
FIG. 3 depicts aspects of the method for measuring the magnetic fields exhibited by atoms in a Stimulated Raman Transition process in accordance with the present invention.

FIG. 3 presents a schematic picture of a two-photon stimulated Raman transition process used in a method for imaging magnetic fields according to the present invention. In an exemplary embodiment, the atoms are held in a point trap such as a magneto-optical trap in a vacuum chamber and so form a point source at time T=0, at x=0 along the x-axis. When the atoms are released from the trap, they spread out along the x-axis according to their velocities, with the location of any atom along the x-axis at any time being v*T, where v equals the atom's velocity and T equals the time. In FIG. 3, these velocity classes are shown as lines indicating the trajectories that the atoms would take as they spread out from each other. At time T=Tr, the atoms are exposed to a short pulse from the two retroreflected Raman beams. Most atoms are not resonant with the Raman beams because they don't satisfy the energy and momentum conservation rules described above. The non-resonant atoms do not change their momentum and thus their trajectories do not change. However, certain atoms have velocities that are resonant, and the momenta of those atoms changes as they absorb the Raman laser beam photons. As described above, these resonances occur at velocities $v=\Delta mv_0\pm\hbar k/M$, where $v_0$ is the average velocity of the individual resonant atoms and Δm can be −1, 0, or 1.

The resonant atoms are shown in FIG. 3 by the dotted and dashed lines, as described in more detail below. For example, a resonant atom in the sample can have velocity $v_0+\hbar k/M$, as shown by the dotted lines 301a and 301b in FIG. 2. When the atom is exposed to the Raman pulse at time T=Tr, its velocity changes to $v_0-\hbar k/M$ because the Raman beam causes a recoil velocity of $2\hbar k/M$. Thus, on average, such an atom has velocity $v_0$. Likewise, the velocity of a resonant atom having velocity $v_0-\hbar k/M$ is changed to $v_0+\hbar k/M$, and so this atom also has an average velocity of $v_0$. As a result of the reactions of these two resonant classes of atoms to the Raman beam, there is an increase in the number of atoms in the cloud having an average velocity of $v_0$. The values of $v_0$ are proportional to the magnetic field B, and are defined by $2k^*v_0=\pm\Delta m\omega_L$, where $\omega_L=2\pi g_F\mu_B B/\hbar$, and Δm can take on values of −1, 0, and +1 as described above. In the expanded atom cloud this results in an increased number of atoms at locations $x_0=v_0T$. Thus, as shown in FIG. 2, there are three possible locations of $x_0$ corresponding to the three possible values of Δm, i.e., the locations at 303a and 303b, each corresponding to Δm=±1 transitions, and the location at 303c, corresponding to Δm=0. In images taken of the atom cloud, for example, images recorded at time T=Ti on the CCD camera, these increases in atom number create increased luminance at these three locations, as can be seen in the images shown in FIGS. 2B, 4A, 4B, and 6A.

FIGS. 4A and 4B depict images of an atom sample in a non-uniform magnetic field. Specifically, this example field is a linear quadrupole field, defined by B=B'*(x, y, −2z), where B' is the magnetic field gradient. Because the field is spatially varying, the resonant velocity classes are also spatially varying in a manner proportional to the magnetic field magnitude at different locations. The images in FIG. 4A are due to different values of B', as labeled in the figure. The images in FIG. 4B are numerical simulations of the expected patterns.

Thus, the resonant speeds of the atoms in the atom cloud are a direct reflection of the magnetic fields within the cloud, and so the distribution of atoms and information regarding the magnitude and distribution of the magnetic field within the atom cloud can easily be obtained by examination of the images taken of the atom cloud.

Because the fields can be measured by this technique, the technique may also be used to provide a simple means for cancelling ambient magnetic fields, or producing a desired magnetic field variation. Thus, in accordance with the present invention, once the intrinsic magnetic field of the atom sample is determined by analysis of the images of the atom cloud as described above, the magnetic field distribution within the sample can then be cancelled or altered by the application of an external magnetic field, and the effect of the application of such an external field can also be analyzed using images of the atom cloud. For example, when the field is zero, the separation between the two stripes observed for a uniform magnetic field becomes zero. This condition can be achieved when the appropriate current is supplied to Helmholtz coils $102a$, $102b$, and $102c$ shown in FIG. 1 to cancel out the intrinsic field. In other cases, a desired gradient can be achieved with application of additional magnetic field coils and the presence of the desired gradient can be identified by measuring the degree of tilt of the stripe features.

The method of the present invention can be further understood with reference to the following experimental examples.

Figure 5:
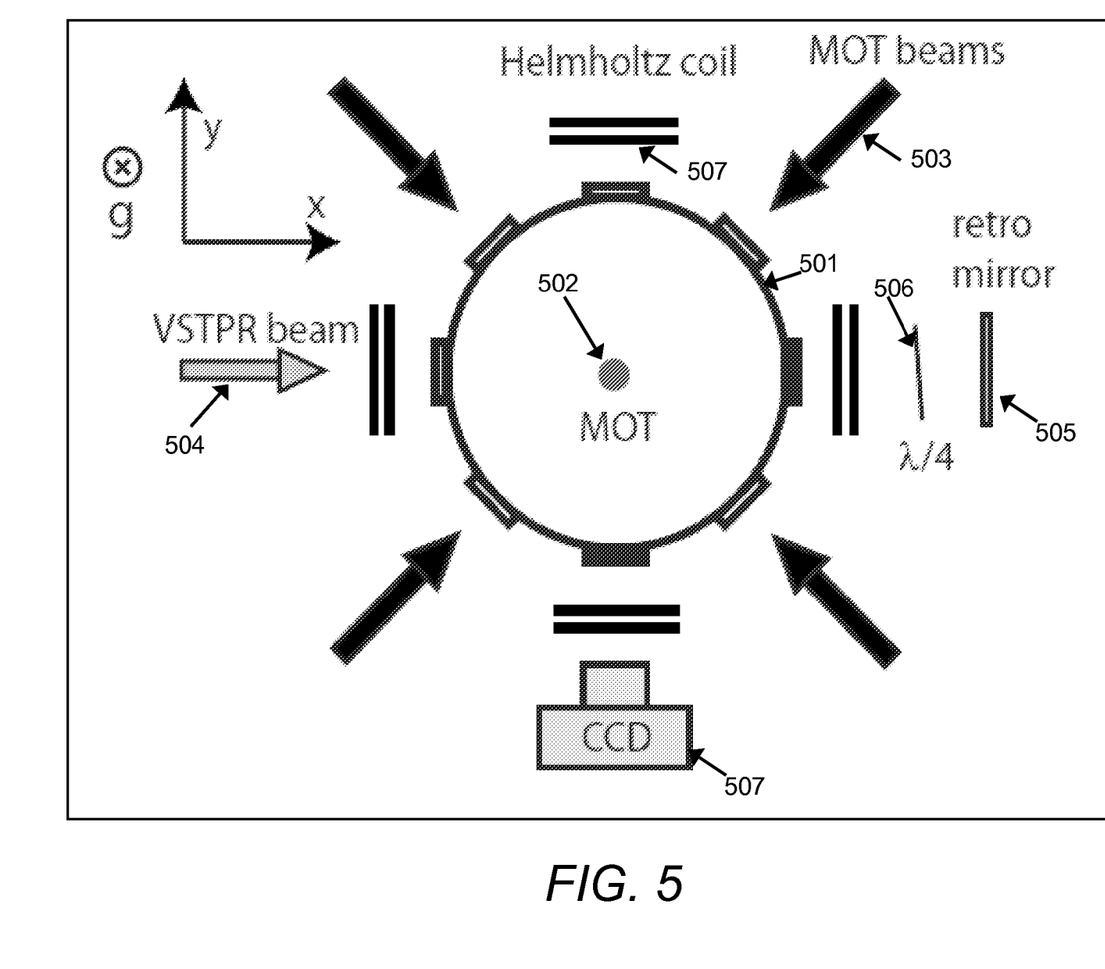
FIG. 5 depicts a layout of elements of an apparatus in an experimental use of the method of the present invention.

The layout of the system used in an exemplary application of the present invention is shown in FIG. 5. The experiment begins with a vacuum chamber 501 containing a vapor cell magneto-optical-trap (MOT) 502 having a diameter of ≈500 μm containing an atom sample of $10^7$ $^{85}$Rb atoms at a temperature of ≈200 μK. The MOT is created by MOT cooling and repump beams 503 and MOT coils (not shown). A Raman beam 504, which can be derived from one of the MOT laser beams 503 or from a separate laser source, propagates along the x-direction and is retroreflected in a lin ⊥ lin configuration by retro mirror 505 and λ/4 waveplate 506.

The magnetic field in the atom sample can be controlled by changing the current in the three orthogonal Helmholtz bias coils 507. In this experiment, the current in the z-directed Helmholtz coils is changed to effect a change in the magnetic field in the z-direction. The magnetic field B at the atom cloud has components $B_i=\alpha_i(I_i-I_{0i})$, where $\alpha_i$ are the slopes $dB_i/dI_i$, $I_i$ are the applied currents, and $I_{0i}$ are the currents required for compensation along each Cartesian direction.

At time T=0, the atoms are released from MOT 501 by extinguishing all MOT laser beams 503 and the MOT coils. The bias magnetic coils 507 remain on. At time Tr≈20 ms, the Raman beam pulse aimed in the x-direction is switched on for 5 ms and at Ti=40 ms, the remaining MOT cooling and repump beams 503 are switched on to image the expanded cloud onto the CCD camera 507. Of course, these times are merely sample times, and can be adjusted.

Figure 6A:
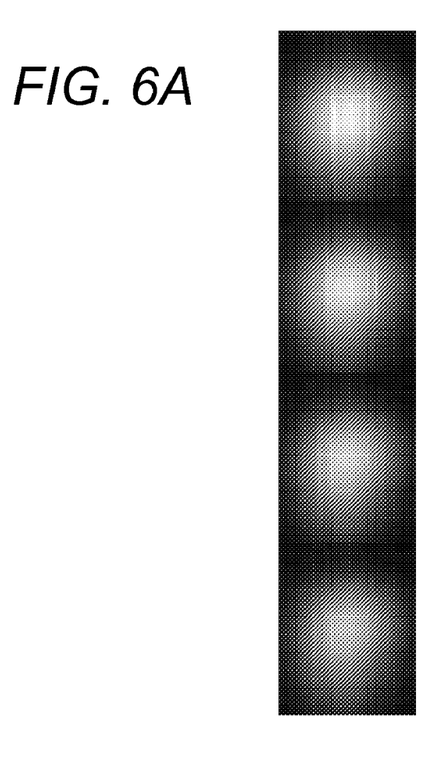
FIGS. 6A and 6B depict aspects of an expanded atom cloud at different Helmholtz currents after exposure to a Raman beam.

In a first experiment, the current in the z-directed Helmholtz coils is changed to effect a change in the magnetic field in the z direction. FIG. 6A shows images recorded by CCD camera 507 in accordance with the present invention for four different current settings in the Helmholtz coils, i.e., at 260 mA, 330 mA, 400 mA, and 450 mA. As described above, the Raman beam pulse creates perturbations in the velocities of resonant atoms in the atom cloud and as seen in FIG. 6A, such resonant atoms appear as vertical stripes in the expanded cloud. As described above, the different current levels change the magnetic field, and the different magnetic fields affect the separation of the stripes seen in the image.

Figure 6B:
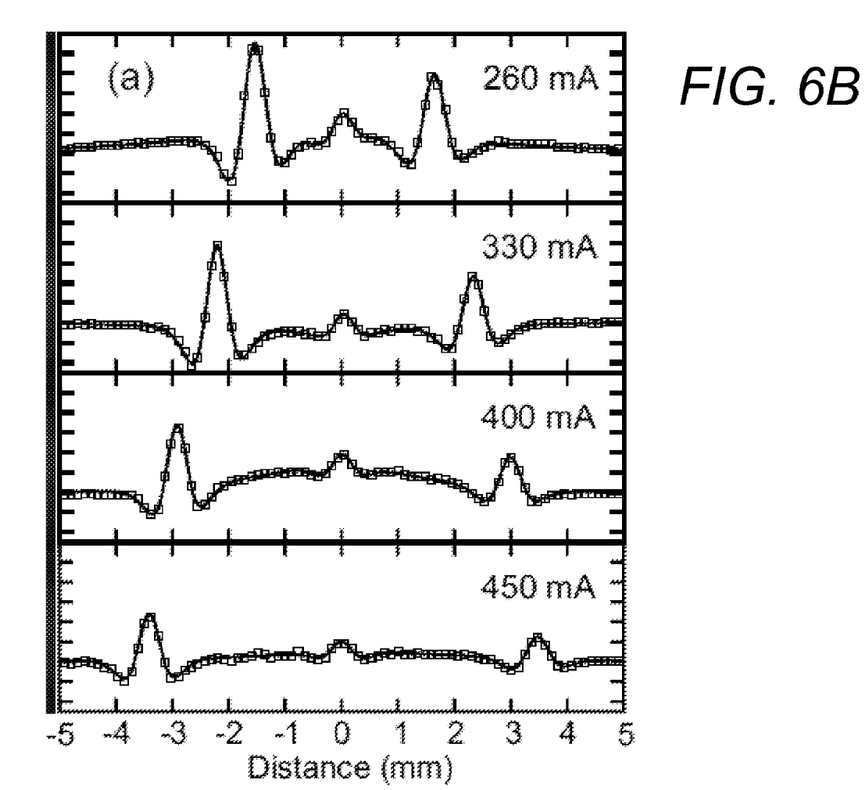

To show the stripe features more clearly, a first image with a Raman beam pulse present can be recorded, followed by another image without the Raman pulse. When data of these images, for example pixel intensity values, are input into a computer and subtracted, an image can be created that shows only the velocity classes that are in resonance. FIG. 6B shows plots of the cross sections of the images created from such a subtraction, and show peaks and dips on a flat background. The current levels shown in FIG. 6B for this demonstration are the same as those used in FIG. 7A, so the spatial location of each peak in FIG. 6B corresponds to the vertical lines in the images shown in FIG. 6A, and the height of the peak corresponds to the intensity of the line, with the brighter (i.e., more intense) lines exhibiting a higher peak in the plot. In addition, in accordance with the description above regarding resonance of certain atoms in the cloud, the peaks also correspond to atoms having an average velocity satisfying the relation $2k \cdot v_0 = \pm \Delta m \omega_L$ that participated in the Raman process, where in general, $\omega_L$ is a function of position due to spatially varying magnetic fields.

Figure 7:
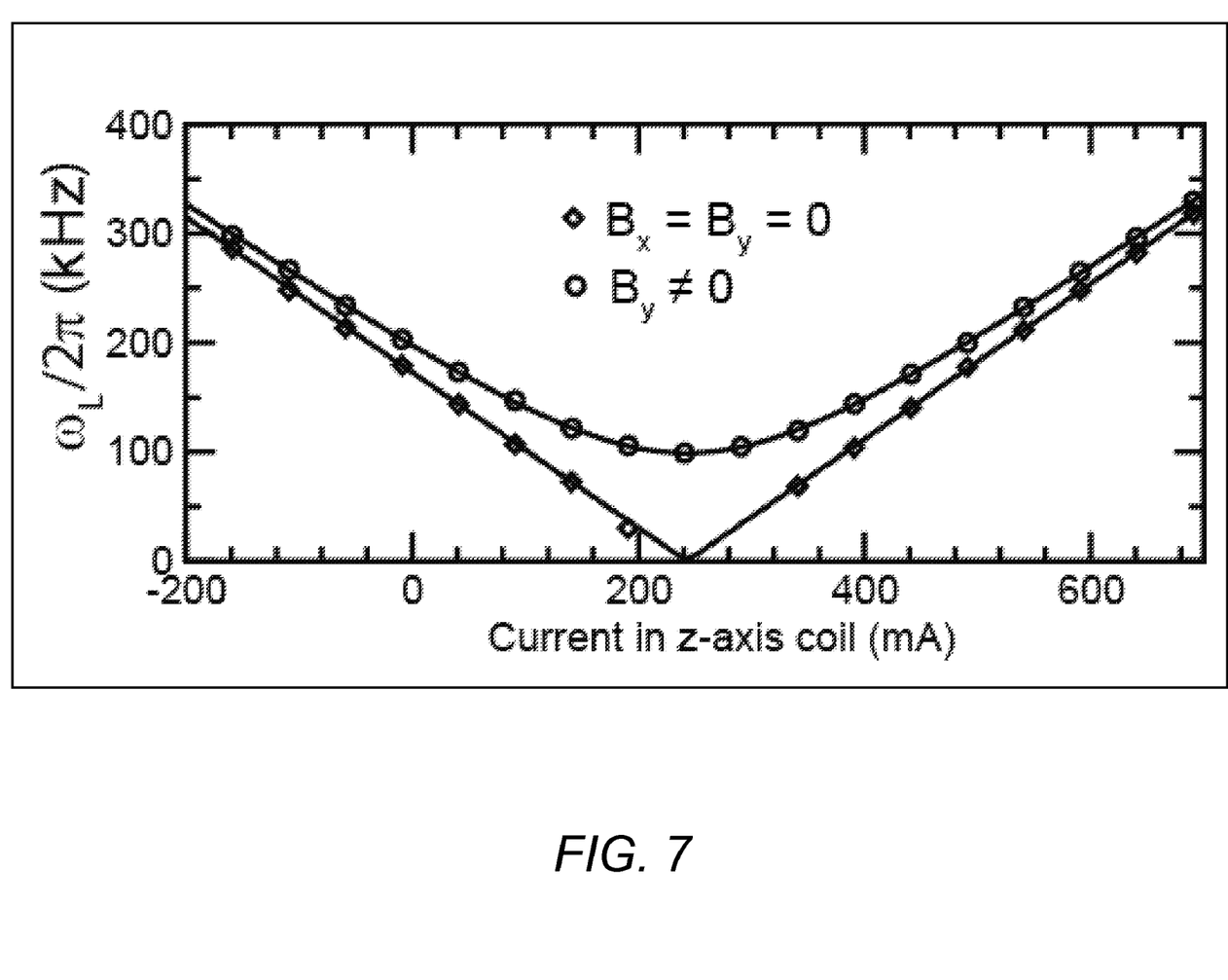
FIG. 7 depicts a plot of measured magnetic field strength as a function of current in the z-directed Helmholtz coil under different conditions.

FIG. 7 shows scalar magnetic field measurements for several current settings in the Helmholtz coils. As described above, ΔL, i.e., the separation of the stripes shown in the images taken in accordance with the present invention, is proportional to $B=(B_x^2+B_y^2+B_z^2)^{1/2}$, where the value of $B_i=\alpha_i(I_{i-I0i})$, $\alpha_i$ are the slopes $dB_i/dI_i$, $I_i$ are the applied currents, and $I_{0i}$ are the currents required to null the magnetic field along the i-axis. The minimum stripe separation is a measure of the transverse magnetic field. The current at the minimum stripe separation, $I_{0i}$ is the current required to offset ambient magnetic fields for that axis (in this case, the z-axis).

A plot of ΔL versus the current in the z-directed Helmholtz bias coil thus traces a hyperbola as shown in FIG. 7, the minimum of which determines the field component perpendicular to z and the compensation current $I_{0z}$ required to cancel $B_z$. Two cases are shown in FIG. 7, one with nonzero $B_y$, and one for the case in which $B_x$, $B_y$ have been zeroed. Fits to these plots determine the sensitivity of the technique. For example, the compensation current $I_{0z}$ was 243.1(2), which corresponds to an error of 300 μG. The technique also provides a measure of the properties of the coil itself: The slope of the curve in the z-direction $\alpha_z$=1.524(2) Gauss/Amp, is a measure of how much magnetic field is produced by the coil for a given amount of current. This value of $\alpha_z$ depends on the specific size of the coil used and can vary depending on the implementation. Note also that in the case for nonzero $B_y$ in FIG. 7, the minimum of the hyperbola is the magnitude of $B_y$. Thus, in accordance with the present invention, the direction of the magnetic field can be ascertained by analyzing the minimum stripe separations along the different axes.

As noted above, in accordance with the present invention, it is possible to zero the magnetic field by viewing real-time images of the expanded cloud and adjusting the currents along each axis for minimum stripe separation. We note that when the total magnetic field is close to zero, the stripes begin to overlap and are no longer resolved. Compensation is achieved when the overlap is maximized, resulting in a single narrow feature. In our experience, this real-time adjustment of the stripe separation results in compensation to milliGauss levels without any data analysis.

In addition, the visibility of the stripe features is dependent on several factors. First, since the image on the CCD camera is a convolution of the initial MOT size with the velocity distribution, the contrast increases for trapped samples with smaller physical dimensions. As noted above, the imaging optimally should be performed after the cloud has expanded enough that two velocity classes separated by $2\hbar k/M$ can be resolved. If the initial MOT has a radius R, imaging performed after a time $R/v_{rec}$ from the release of the atoms from the trap, where $v_{rec}=\hbar k/M$ will achieve such separation. However, in accordance with the present invention, the stripe features in the atom cloud are easily observed with imaging times $T_i$ significantly less than $R/v_{rec}$ because the effect does not require that the recoil velocities be resolved, only that perturbations to the average velocity distribution can be observed. In addition, in the images taken according to the method of the present invention, the spatial resolution of stripe features representing the imaged magnetic field is less than or equal to the original trap size, i.e., no larger than the radius R of the trap. Thus, the method of the present invention allows for high spatial resolution of the imaged magnetic field over the entire atom cloud in a single image shot.

Figure 8A:
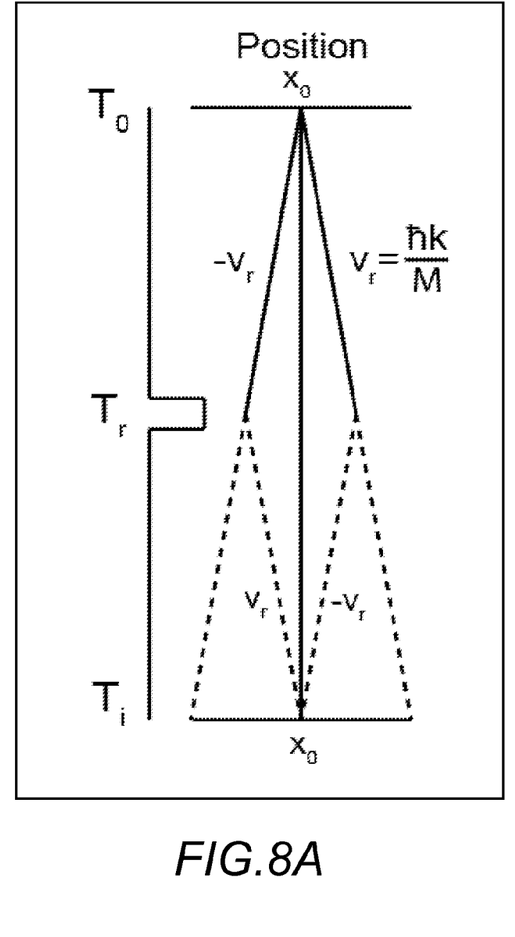
FIGS. 8A-8C depict aspects of the effect on the image of different timing of the application of a Raman beam in accordance with the present invention.
Figure 8B:
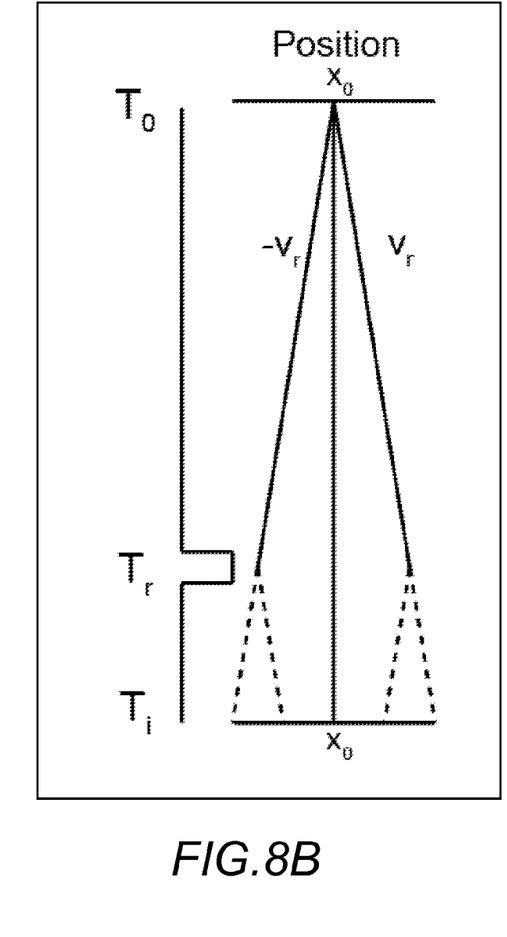

Other parameters that control the visibility of the stripes are the duration and timing of the Raman pulse. Because this measurement is time averaged over the duration of the pulse, shorter pulses reduce blurring effects due to time-varying fields. Furthermore, pulses applied at $Tr=Ti/2$ can maximize the stripe contrast. To illustrate this, consider an atom originating from $x=0$ along the x-axis, with no magnetic field present. In this case, the average velocity of the resonant atoms is $v_0=0$. As described above, the atom can oscillate between velocity $+v_r=+\hbar k/M$ and velocity $-v_r=-\hbar k/M$, where $\pm\hbar k$ is the change in momentum due to the Raman pulse. This is shown in FIGS. 8A and 8B. Looking at the atom starting out with a speed $+v_r$ corresponding to momentum $+\hbar k$, if we apply the Raman pulse at $Tr=Ti/2$, the atom will reverse momentum to $-\hbar k$ by absorption of $2\hbar k$ momenta from the Raman beam, and will end up at $x=0$ at Ti. Likewise, an atom starting out with a speed $-v_r$ corresponding to momentum $-\hbar k$ will reverse momentum to $+\hbar k$, and also will end up at $x=0$ at Ti. Therefore, both sets of atoms will overlap at $x=0$ and will lead to an increased luminance at that point. If the Raman pulse does not occur at Ti/2, these sets will not overlap, because they do not spend the same amount of time in the reversed momentum state. Although the signal will be increased around $x=0$, the visibility/contrast will be reduced because the two sets do not perfectly overlap.

FIGS. 8A and 8B show the effect on stripe contrast of the time of the pulse Tr for atoms in zero field, using Raman pulse durations of 200 μs at different Tr. The simple geometrical pictures shown in FIGS. 8A and 8B suggest an approximate functional form for the background-subtracted stripe cross section under these conditions $$Y(x)=G(x_0-2v_r\Delta T)+G(x_0+2v_r\Delta T)-G(x_0-v_rT_i)+G(x_0+v_rT_i)$$

where $Y(x)$ is the intensity and $G(x_0)$ is a Gaussian centered at $x_0$.

Figure 8C:
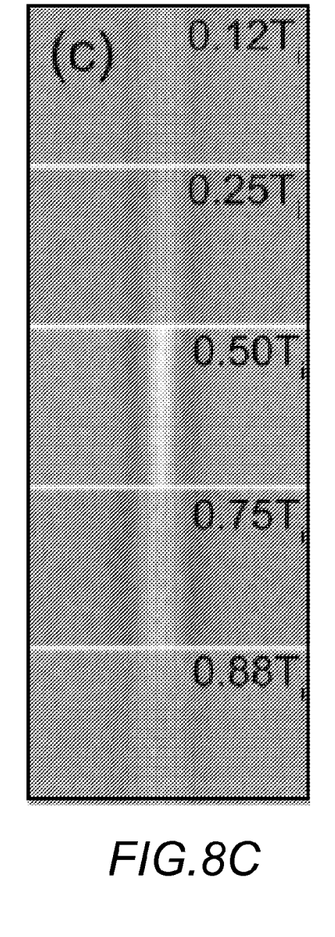
Figure 9:
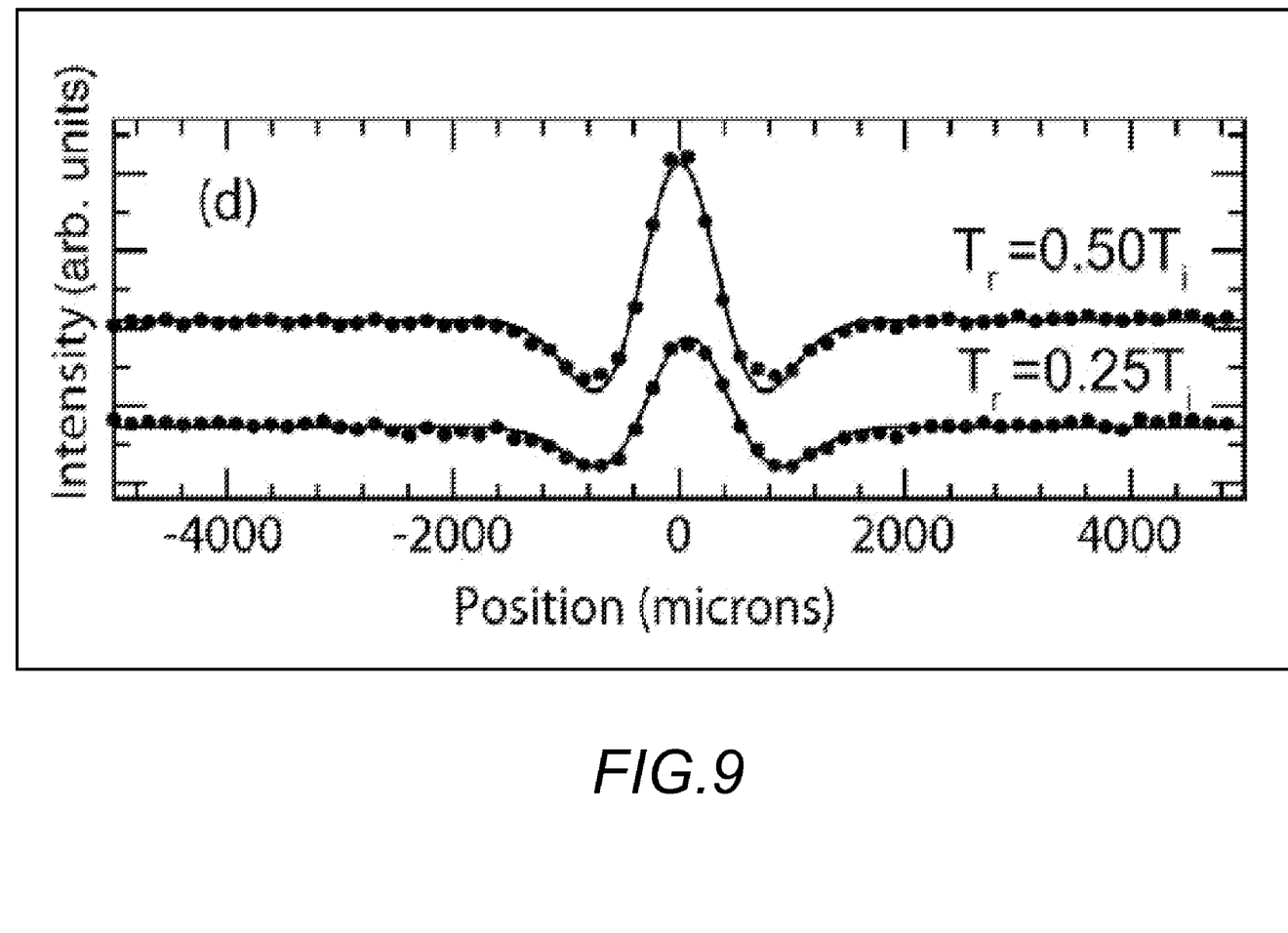
FIG. 9 shows a cross section of the fluorescence features obtained when the falling atom sample is exposed to the Raman beam, in accordance with the present invention. The solid line is a theoretical fit.

This effect was demonstrated in a real atom sample as shown in the images depicted in FIG. 8C, which shows this change of visibility for different Tr. Thus, as is easily seen in FIG. 8C, images of a stripe feature in an atom cloud taken at $Tr=0.12Ti$ and $Tr=0.88Ti$ have the least visible stripe features, while $Tr=0.5Ti$ has the most distinct one. FIG. 9 shows images taken at various values of Tr and shows that the brightest intensity occurs at $Tr=Ti/2$. This is confirmed by the plots in FIG. 10, which show a much higher intensity peak at $Tr=0.5Ti$ than at $Tr=0.25Ti$.

Thus, as described herein, the system and method according to the present invention can measure the magnetic field within an atom sample through simple kinematic relationships. Because the resonant velocity classes are narrow for typical magnetic fields, the images of the atom cloud after expansion in the magnetic field show distinct patterns that can be easily analyzed using information about these kinematic relationships. Moreover, the system and method of the present invention are capable of achieving spatial resolutions below 1 mm over an extended region in a single measurement cycle, allowing for rapid measurement and analysis of the magnetic field.

It should be appreciated that one or more aspects of a method for imaging and analyzing the magnetic fields in an atom sample as described herein can be accomplished by executing one or more sequences of one or more computer-readable instructions read into a memory of one or more computers from volatile or non-volatile computer-readable media capable of storing and/or transferring computer programs or computer-readable instructions for execution by one or more computers. Volatile computer readable media that can be used can include a compact disk, hard disk, floppy disk, tape, magneto-optical disk, PROM (EPROM, EEPROM, flash EPROM), DRAM, SRAM, SDRAM, or any other magnetic medium; punch card, paper tape, or any other physical medium such as a chemical or biological medium. Non-volatile media can include a memory such as a dynamic memory in a computer.

Although particular embodiments, aspects, and features have been described and illustrated, it should be noted that the invention described herein is not limited to only those embodiments, aspects, and features. It should be readily appreciated that these and other modifications may be made by persons skilled in the art, and the present application contemplates any and all modifications within the spirit and scope of the underlying invention described and claimed herein.

What is claimed is:

1. A method for imaging a magnetic field within an atom cloud, comprising:

trapping an ultracold atom sample in a trap situated within a vacuum chamber;

at time $T_0$, releasing the atom sample from the trap, the atom sample falling in the z-direction due to gravity and expanding into an atom cloud, each of the atoms in the atom cloud having a velocity in one of the +x-direction and the −x-direction, a distance traveled by each atom in the ±x-direction at any time being approximately equal to $x=vT$, where v equals the atom's velocity and T equals time;

at time $Tr>T_0$, illuminating the atom cloud with a first Raman beam traveling in the +x direction and a second Raman beam collinear with the first Raman beam and traveling in the −x direction, the first and second Raman beams causing a change in velocity in resonant atoms in the atom cloud, wherein a first plurality of the resonant atoms has an average velocity of $+v_0$ and travels along the +x-direction a distance of $+x_0=+v_0T$ at time T, and further wherein a second plurality of the resonant atoms has an average velocity of $-v_0$ and travels along the −x-direction a distance of $-x_{-0}=-v_0T$ at time T, each of $+x_0$ and $-x_0$ being dependent on the magnetic field surrounding the atom cloud; and at time Ti>Tr, imaging the atom cloud in a single imaging cycle, wherein the entire magnetic field within the atom cloud is imaged in the single imaging cycle, a spatial resolution of the imaged magnetic field being no larger than a size of the trap;

wherein the first and second plurality of resonant atoms appear in the image as lines in the atom cloud at the $+x_0$ and $-x_0$ positions along the +x direction and the −x direction; and further wherein a configuration of the lines is being indicative of at least one characteristic of the magnetic field.

2. The method for imaging a magnetic field according to claim 1, wherein the first and second plurality of resonant atoms appear as two parallel lines in the atom cloud separated by $\Delta x = \omega_L T_i/k$, where k is a wavevector of a resonant photon in one of the first and second Raman beams, $\omega_L$ is the Larmor precession frequency, and $T_i$ is the imaging time; and further wherein a presence of two parallel lines in the image is indicative of a presence of a uniform magnetic field.

3. The method for imaging a magnetic field according to claim 1, wherein the first and second plurality of resonant atoms appear as first and second non-parallel lines in the atom cloud, a presence of the non-parallel lines being indicative of the presence of a non-uniform magnetic field, and further wherein a configuration of the non-parallel lines is indicative of a shape of a gradient of the non-uniform magnetic field.

4. The method for imaging a magnetic field according to claim 3, wherein the non-parallel lines comprise first and second tilted lines, a configuration of the tilted lines including a slope of the tilted lines, and further wherein the slope is indicative of the strength of the magnetic field gradient at any point along at least one of the x-, y-, and z-directions.

5. The method for imaging a magnetic field according to claim 1, wherein the trap comprises a magneto-optical trap formed by a plurality of orthogonal lasers.

6. The method for imaging a magnetic field according to claim 5, wherein the first and second Raman beams are generated by one of the lasers forming the magneto optical trap.

7. The method for imaging a magnetic field according to claim 1, wherein the first and second Raman beams are generated by a single laser, the second Raman beam being formed by retroreflecting the first Raman beam off a mirror situated opposite a source of the first Raman beam.

8. The method for imaging a magnetic field according to claim 1, wherein the first Raman beam is generated by a first laser source and the second Raman beam is generated by a second laser source.

9. The method for imaging a magnetic field according to claim 1, wherein time Ti=2Tr.

10. The method for imaging a magnetic field according to claim 1, wherein time $Ti=R/v_{rec}$ where R is the radius of the trap initially holding the atom sample and $v_{rec}=\hbar k/M$.

11. The method for imaging a magnetic field according to claim 1, further comprising: activating a current through at least one Helmholtz coil surrounding the vacuum chamber to control the magnetic field in at least one of the x, y, and z directions.

12. A method for determining characteristics of a magnetic field within an atom cloud, comprising:

trapping an ultracold atom sample in a trap situated within a vacuum chamber;

at time $T_0$, releasing the atom sample from the trap, the atom sample falling in the z-direction due to gravity and expanding into an atom cloud, each of the atoms in the atom cloud having a velocity in one of the +x-direction and the −x-direction, a distance traveled by each atom in the ±x-direction at any time being approximately equal to x=vT, where v equals the atom's velocity and T equals time;

at time Tr>$T_0$, illuminating the atom cloud with a first Raman beam traveling in the +x direction and a second Raman beam collinear with the first Raman beam and traveling in the −x direction, the first and second Raman beams causing a change in velocity in resonant atoms in the atom cloud, wherein a first plurality of the resonant atoms has an average velocity of $+v_0$ and travels along the +x-direction a distance of $+x_0=+v_0T$ at time T, and further wherein a second plurality of the resonant atoms has an average velocity of $-v_0$ and travels along the −x-direction a distance of $-x_{-0}=-v_0T$ at time T, each of $+x_0$ and $-x_0$ being dependent on the magnetic field surrounding the atom cloud; and at time Ti>Tr, imaging the atom cloud in a single imaging cycle, wherein the entire magnetic field within the atom cloud is imaged in the single imaging cycle, a spatial resolution of the imaged magnetic field being no larger than a size of the trap; the first and second plurality of resonant atoms appearing in the image as lines in the atom cloud at the $+x_0$ and $-x_0$ positions along the +x direction and the −x direction, a configuration of the lines being indicative of at least one characteristic of the magnetic field;

receiving data of the image of the atom cloud from the single imaging cycle at a computer operatively connected to the imaging device, the computer having appropriate software configured to receive and analyze data of the image of the atom cloud and being further configured to determine and output information regarding characteristics of the magnetic field from the image; and analyzing, at the computer, the image of the atom cloud to determine characteristics of the magnetic field, wherein data of the image is transformed into data of the magnetic field.

13. The method for determining characteristics of a magnetic field according to claim 12, wherein the first and second plurality of resonant atoms appear as two parallel lines in the atom cloud separated by $\Delta x = \omega_L T_i/k$, where k is a wavevector of a resonant photon in one of the first and second Raman beams, $\omega_L$ is the Larmor precession frequency, and $T_i$ is the imaging time, a presence of two parallel lines in the image being indicative that the magnetic field is uniform, the method further comprising determining, at the computer, a strength of the magnetic field based on a configuration of the parallel lines in the image.

14. The method for determining characteristics of a magnetic field according to claim 12, wherein the first and second plurality of resonant atoms appear as first and second non-parallel lines in the atom cloud, a presence of the non-parallel lines being indicative of the presence of a non-uniform magnetic field, the method further comprising determining, at the computer at least one of a shape of a gradient and a magnitude of the non-uniform magnetic field based on a configuration of the non-parallel lines.

15. The method for determining characteristics of a magnetic field according to claim 14, wherein the non-parallel lines comprise first and second tilted lines, a configuration of the tilted lines includes a slope of at least one of the tilted lines, the method further comprising determining, at the computer, the strength of the magnetic field at any point along at least one of the x-, y-, and z-directions based on the slope of at least one of the tilted lines.

16. A system for imaging a magnetic field within an atom cloud, comprising:
- a vacuum chamber housing a trap configured to confine an ultracold atom sample;
- a first laser source generating a first Raman laser beam traveling in the +x-direction and a second laser source generating a second Raman laser beam collinear with the first Raman beam and travelling in the −x-direction, the first and second Raman beams illuminating an atom cloud formed by the atom sample as it falls in the z-direction after being released from the trap to effect a change in velocity of resonant atoms in the atom cloud, a first plurality of the resonant atoms traveling a distance $+x_0$ along the x-direction and a second plurality of the resonant atoms traveling a distance $-x_0$ along the x-direction, the distance $\pm x_0$ being dependent on the magnetic field; and
- an imaging device having an optical axis along a y-direction perpendicular to the z-direction and the x-direction;
- wherein the imaging device images the atom cloud in a single imaging cycle after the atom cloud has been illuminated by the first and second Raman beams, the entire magnetic field within the atom cloud being imaged in the single imaging cycle, a spatial resolution of the imaged magnetic field being no larger than a size of the trap; and
- wherein the first and second plurality of resonant atoms appear in the image as lines in the atom cloud at the $+x_0$ and $-x_0$ positions along the x-directions, a configuration of the lines being indicative of at least one characteristic of the magnetic field.

17. The system for imaging a magnetic field according to claim 16, further comprising a mirror and a $\lambda/4$ waveplate placed opposite the first laser source so that the first Raman laser beam from the first laser source is retroreflected by the mirror and orthogonally polarized by the $\lambda/4$ waveplate to form the second Raman laser beam.

18. The system for imaging a magnetic field according to claim 16, wherein the second laser source is independent from the first laser source.

19. The system for imaging a magnetic field according to claim 16, further comprising a set of orthogonal Helmholtz coils situated around the vacuum chamber, wherein the Helmholtz coils are configured to provide a magnetic field to offset an ambient magnetic field within the atom cloud.

20. The system for imaging a magnetic field according to claim 16, further comprising a set of three Helmholtz coils situated around the vacuum chamber, wherein a current in at least one or more of the Helmholtz coils is configured to enable measurement of at least one orientation of an ambient magnetic field within the atom cloud.

* * * * *